United States Patent
Kernhof et al.

(10) Patent No.: US 6,847,237 B2
(45) Date of Patent: Jan. 25, 2005

(54) 32V H-BRIDGE DRIVER WITH CMOS CIRCUITS

(75) Inventors: Jürgen Kernhof, Bissingen (DE); Eric Marschalkowski, München (DE)

(73) Assignee: Dialog Semiconductor GmbH, Kirchheim/Teck-Nabern (DE)

( * ) Notice: Subject to any disclaimer, the term of this patent is extended or adjusted under 35 U.S.C. 154(b) by 0 days.

(21) Appl. No.: 10/613,600

(22) Filed: Jul. 3, 2003

(65) Prior Publication Data

US 2004/0207453 A1 Oct. 21, 2004

(30) Foreign Application Priority Data

Apr. 17, 2003  (EP) ............................................. 03368028

(51) Int. Cl.[7] .............................................. H03B 1/00
(52) U.S. Cl. ............................ 327/110; 360/46; 363/63
(58) Field of Search ........................ 327/108–112, 423, 327/424, 427; 326/86–91; 363/16–17, 63, 58; 360/461, 67, 68

(56) References Cited

U.S. PATENT DOCUMENTS

| | | | | |
|---|---|---|---|---|
| 5,119,000 A | * | 6/1992 | Schultz ........................ 318/254 |
| 5,796,276 A | * | 8/1998 | Phillips et al. .............. 327/108 |
| 5,973,368 A | * | 10/1999 | Pearce et al. ............... 257/368 |
| 6,185,118 B1 | | 2/2001 | Sander et al. ............... 363/132 |
| 6,331,748 B1 | * | 12/2001 | Hong .......................... 310/318 |
| 6,331,794 B1 | * | 12/2001 | Blanchard ................... 327/112 |
| 6,636,024 B2 | * | 10/2003 | Zametzky ................... 323/282 |
| 2002/0118497 A1 | * | 8/2002 | Petruska ...................... 361/23 |

FOREIGN PATENT DOCUMENTS

| | | | |
|---|---|---|---|
| DE | 19803040 A1 | 8/1998 | ............ H02H/3/02 |
| EP | 1193824 A2 | 4/2002 | ........... H02H/11/00 |

* cited by examiner

*Primary Examiner*—Minh Nguyen
(74) *Attorney, Agent, or Firm*—George O. Saile; Stephen B. Ackerman

(57) ABSTRACT

A motor bridge driver interface, implemented in an ASIC using cost-efficient CMOS technology, is designed to control four external MOS power transistors in a H-bridge configuration for DC-motor driving to achieve accurate and fast switching. Main components of the -interface are comprising a charge pump for generating the control voltage for the high-side N-channel MOS transistors, high-side (HSD) circuits, low-side (LSD) circuits and a complex digital interface for supplying the control signals in a programmable timing scheme. A "strong" charge pump is used to realize a simple CMOS switch to steer the output to the high-side transistors of said H-bridge. The motor bridge is connected to the battery supply by an additional N-channel MOS transistor to implement a reverse supply protection.

18 Claims, 5 Drawing Sheets

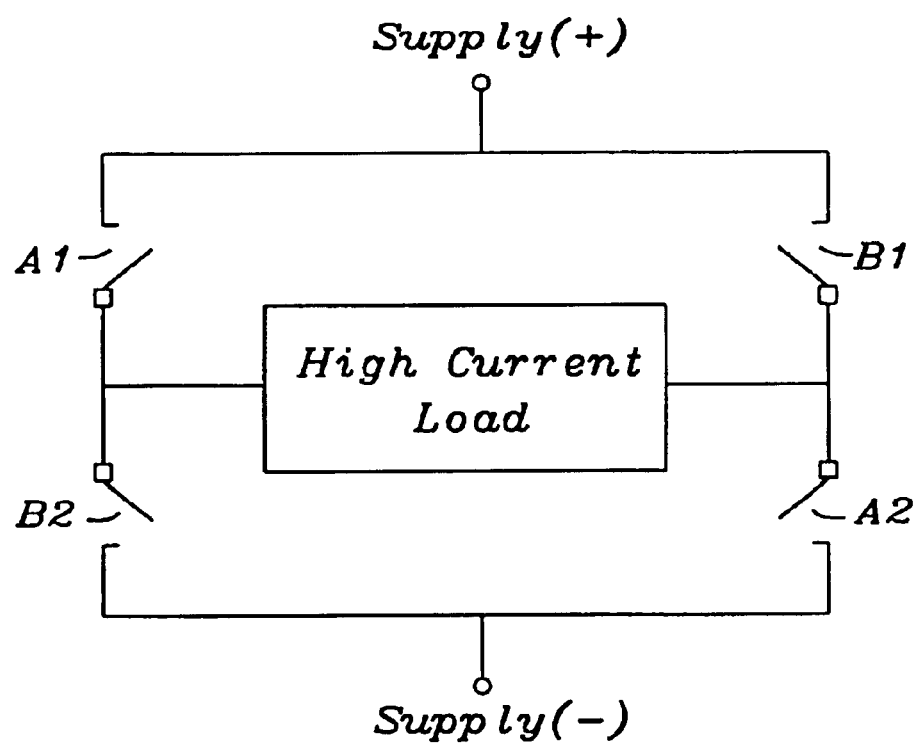
FIG. 1 - Prior Art

32V H-BRIDGE DRIVER WITH CMOS CIRCUITS

BACKGROUND OF THE INVENTION (1) Field of the Invention

The present invention relates to integrated circuits for a motor bridge interface, and particularly to control four external N-channel MOS power transistors in a H-bridge configuration for DC-motor driving.

(2) Description of the Prior Art

Motors play a key role in the increasing comfort and convenience in today's vehicles, providing functions from adjusting seats or headlamps to lifting windows and moving sunroof doors. However, making the motor easy to control, safe, and reliable isn't an easy task Most of the motors in today's vehicles conduct less than an average of 6 Ampere.

Motors normally need to be operated in both forward and reverse. This requirement leads to a circuit layout known as an H-bridge. FIG. 1 prior art shows a simple conceptual schematic of an H-bridge. A basic H-bridge has four switches, relays, transistors, or other means of completing a circuit to drive a motor. In FIG. 1 prior art the switches are labelled A1, A2, B1, and B2. Since each of the four switches can be either open or closed, there are $2^4=16$ combinations of switch settings. Many are not useful and in fact, several should be avoided since they short out the supply current. For example, the motor spins forward if switches A1 and A2 are closed, the motor spins backwards if B1 and B2 are closed and the motor acts a brake if A1 and B1 are closed. The motor floats freely if all switches are open.

Very often power transistors are acting as semiconductor switches used in H-bridge. Semiconductor switches, as part of an H-bridge or an half-bridge, that are interconnected between a supply potential terminal, that carries a positive operating voltage, and a load output are characterized as high-side switches. Low-side switches, on the other hand, are interconnected between a load output and a second supply potential terminal, e.g. ground potential.

Very often power MOSFETs are used as digital switches. In a typical commercial application four MOSFETs were arranged in a H-bridge configuration, driving the motor forward or backwards. To switch a MOSFET on, the voltage at its gate must be some value greater than the supply voltage. To do this a charge pump is often used. A charge pump uses arrays of capacitors to increase voltage in a circuit. This higher voltage can be used to trigger the bases of the transistor arrays in an H-bridge. In this way, the voltage of the initial signal from the logic circuit needs not to be higher than that of the high-current load being driven.

A common way to control the velocity of a DC motor is through pulse width modulation (PWM). A motor is given full voltage and then turned off, cycling rapidly. Depending on the ratio between on and off time the motor will drive anywhere between full speed and stop. The frequency of this switching is generally above the bandwidth of mechanical switches.

The challenge for the designer of such motor controller is to find a reliable, efficient and cost effective solution. Generally transistors in bipolar or in Double Diffused MOS (DMOS) technology are being used. These technologies are expensive and it is desirable to find solutions that are less expensive.

There are some patents available for this area:

U.S. Patent (U.S. Pat. No. 6,331,794 to Blanchard) describes a technique for supplying drive voltage to the gate of a high-side depletion-mode N-channel MOS-device for phase-leg circuits, H-bridges, or any circuit with a depletion-mode N-channel MOS-device with its source at a voltage above local ground.

U.S. Patent (U.S. Pat No. 6,185,118 to Sander et al.) discloses a driver circuit for driving a half bridge, that has a high-side semiconductor switch and a low-side semiconductor switch that are connected in series between a first and a second supply potential terminal, a drive is allocated to each of the two semiconductor switches that are respectively switched inhibited or transmissive by the respective semiconductor switches according to the direction of a drive signal. A load can be connected between the high-side semiconductor switch and the low-side semiconductor switch. For an inhibited state of a semiconductor switch, its drive terminal is charged approximately with the potential of the second supply potential terminal in order to attain a negative bias voltage of the drive terminal opposite the source terminal.

U.S. Patent (U.S. Pat. No. 5,796,276 to Phillips et al.) describes a high-side gate driving circuit, where a current-mode differential error amplifier is used to regulate the current sourced to the gate. A current path is provided from the gate to the source of the power device, and a constant current is provided to the gate. In a single H-bridge, two transistors will be on at the same time; but the output capacitor of the charge pump lets it supply increased current transiently. A variable current source is also provided, and this current source is controlled by the output of the error amplifier. Preferably a voltage offset (avalanche breakdown diode) is interposed between the gate and source of the high-side driver; this ensures that the feedback loop will operate in a bistable mode, which avoids instability problems.

SUMMARY OF THE INVENTION

A principal object of the present invention is to achieve a cost-effective circuit for a H-bridge driver for DC-motors.

A further object of the present invention is to achieve accurate and fast switching of said H-bridge driver.

In accordance with the objects of this invention a circuit to drive a 32 Volt H-bridge using CMOS technology has been achieved. Said circuit comprises, first, a control logic circuit having an input and an output, wherein the input are control signals defining the behavior of said H-bridge and the output are control signals for the high-side and low-side drivers of said H-bridge, and a power management module having an input and an output wherein the input is a battery voltage and the output is a voltage to feed the low-side drivers and means to drive at the battery voltage level. Furthermore the circuit invented comprises said means to drive at the battery voltage level to drive the two high-side drivers of the H-bridge and a means for reverse supply protection, said means for reverse supply protection, two high-side drivers having an input and an output, wherein the input are control signals from said control logic circuit and a voltage from said charge pump and the output is driving the high-side transistors of said H-bridge via a resistor, and two voltage dividers keeping the reference voltage of said high-side drivers on the voltage levels of the mid-points of said H-bridge. Furthermore the circuit comprises two low-side drivers having an input and an output, wherein the input are control signals from said control logic circuit and a voltage from said power management module and the output is driving the low-side transistors of said H-bridge, two high-side transistors of said H-bridge being connected between battery voltage and the mid-points of said H-bridge having their gates connected to said related high-side drivers, two low-side transistors of said H-bridge being connected between the mid-points of said H-bridge and ground having their gates connected to said related high-side drivers, and a load between the mid-points of said H-bridge.

In accordance with the objects of this invention a circuit to drive a 32 Volt H-bridge using CMOS technology has been achieved. Said circuit comprises, first, a control logic circuit having an input and an output, wherein the input are control signals defining the behavior of said H-bridge and the output are control signals for the high-side and low-side drivers of said H-bridge, and a power management module having an input and an output wherein the input is a battery voltage and the output is a voltage to feed the low-side drivers and means to drive at the battery voltage level. Furthermore the circuit invented comprises a charge pump to drive the high-side drivers of the H-bridge and a means for reverse supply protection comprising two external capacitors and a switching network controlled by a clocking scheme, a means for reverse supply protection driving a transistor to inhibit any reverse supply situation, two high-side drivers having an input and an output, wherein the input are control signals from said control logic circuit and a voltage from said charge pump and the output is driving the high-side transistors of said H-bridge via a resistor, and two voltage dividers keeping the reference voltage of said high-side drivers on the voltage levels of the midpoints of said H-bridge. Additionally the circuit invented comprises two low-side drivers having an input and an output, wherein the input are control signals from said control logic circuit and a voltage from said power management module and the output is driving the low-side transistors of said H-bridge, two high-side transistors of said H-bridge being connected between battery voltage and the midpoints of said H-bridge having their gates connected to said related high-side drivers, two low-side transistors of said H-bridge being connected between the mid-points of said H-bridge and ground having their gates connected to said related high-side drivers, and a load between the midpoints of said H-bridge.

BRIEF DESCRIPTION OF THE DRAWINGS

In the accompanying drawings forming a material part of this description, there is shown:

FIG. 1 prior art shows a simple conceptual schematic of an H-bridge.

DESCRIPTION OF THE PREFERRED EMBODIMENTS

The preferred embodiments disclose a circuit of a cost-efficient motor bridge driver interface using a charge pump and a H-bridge. Said circuit provides has very fast and accurate switching capabilities and can perform up to at least 40 V maximum voltage as required for example by the automotive industry.

Figure 2A:
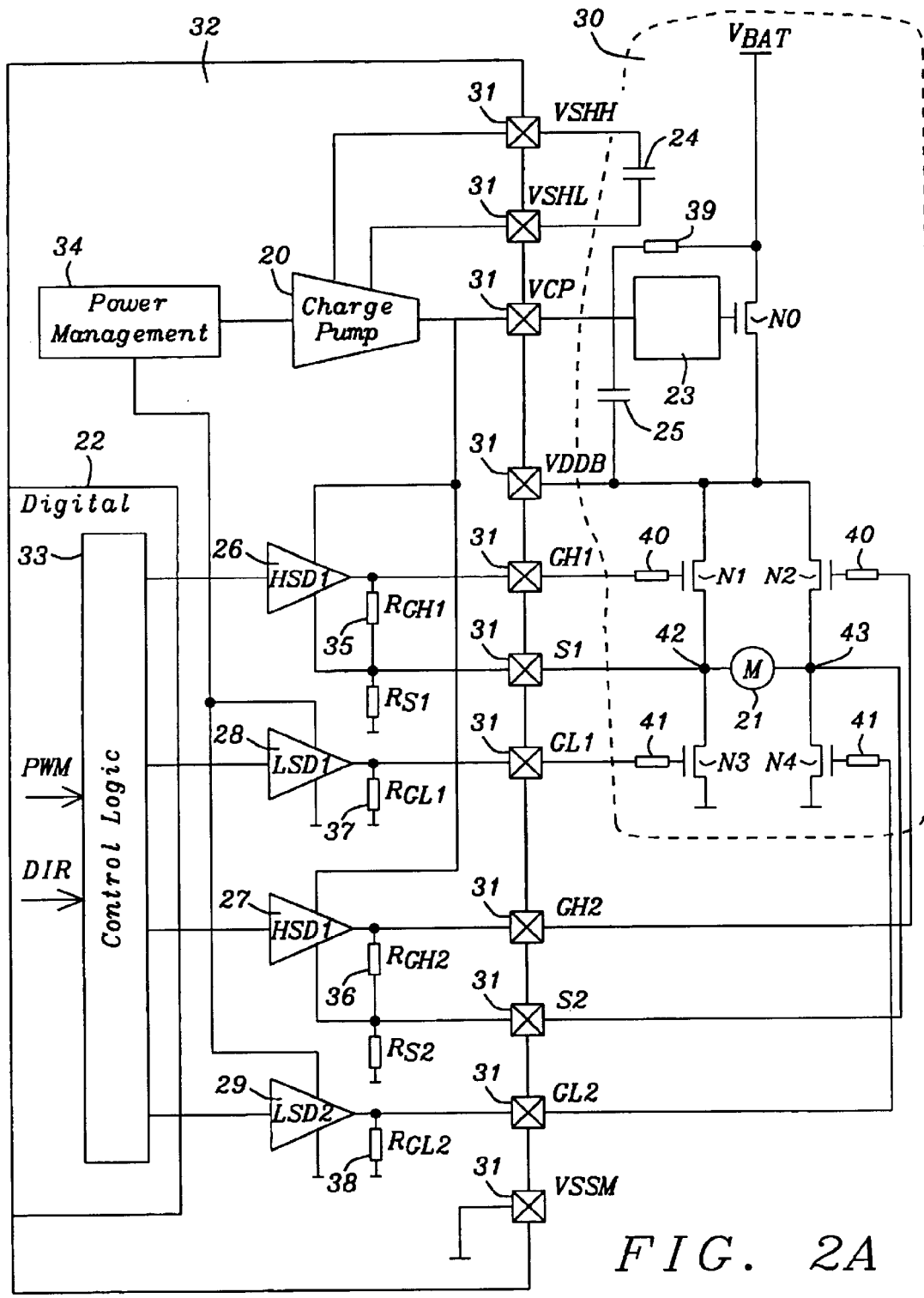
FIG. 2A shows a functional block diagram of a preferred embodiment of a motor bridge driver.

FIG. 2A shows a functional block diagram of a preferred embodiment of said motor bridge driver interface. Said motor bridge driver interface is designed to control four external N-channel MOS power transistors N1, N2, N3, and N4 in a H-bridge configuration for DC-motor 21 driving. The interface, being implemented on an ASIC 32, is comprising a charge pump 20, having two external capacitors 24 and 25, two high-side drivers 0(HSD1 26 and HSD2 27) and two low-side drivers (LSD1 28 and LSD2 29) circuits, two voltage dividers 35 and 36 located at the output of said high-voltage drivers, being connected to the mid-points 42 respective 43 of said H-bridge and to ground, providing a reference voltage to said high-side drivers (HSD), two resistors 37 and 38, each one is connected to the output of a low-side driver and to ground, a complex digital interface 22 comprising a control logic 33 for supplying the control signals in a programmable timing scheme, a power management module 34, supplying the voltage $V_{DD10}$ to said low-side drivers 28 and 29 and to said charge pump 20, and external I/O pins 31. Important control signals for said control logic 33 are the PWM pulses to define the speed of the motor and the DIR bit, defining the direction of the rotation of the motor.

The timing of said PWM pulses preventing any "non-overlapping" is performed by a digital finite state machine (FSM) as part of said digital interface 22.

Figure 2B:
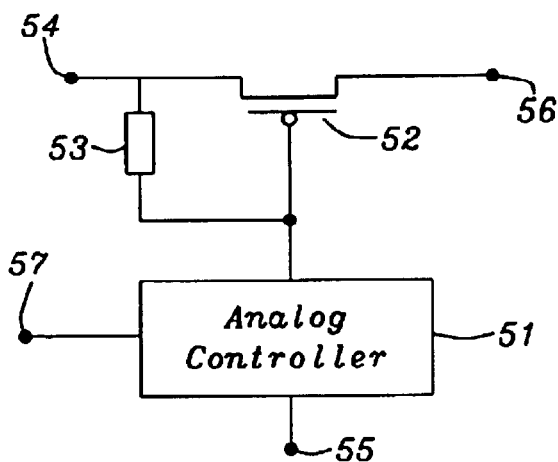
FIG. 2B shows a high-side driver (HSD) used in FIG. 2A.

FIG. 2B shows the detailed structure of a high side driver (HSD) as shown in FIG. 2A signified by numbers 26 or 27. Said HSD is comprising an analog controller 51 providing the controlling current for the FET 52. Said FET is a CMOS-switch to drive the high-side transistors N1 and N2 shown in FIG. 2A. Port 54 is connected to the output voltage $V_{CP}$ of the charge pump 20 shown in FIG. 2A. Port 56 is directly connected to one of the high-side transistors N1 or N2. Port 55 is connected to a mid-point of the H-bridge S1 or S2 shown in FIG. 2B. Port 57 is receiving the PWM input pulses from the control logic 33 shown in FIG. 2A. Resistor 53 provides the required bias voltage between gate and source of the FET switch 52 while said switch is closed.

Said power management module 34, being connected to the battery voltage, comprises several voltage regulators as, e.g., an independent voltage regulator for the charge pump 20.

Said charge pump 20 is providing the voltage $V_{cp}$ to said high-side drivers 26 and 27 and to an external reverse supply protection module 23. Said motor bridge interface is designed to control four external N-channel MOS power transistors N1, N2, N3, and N4 in a H-bridge configuration for DC-motor 21 driving.

Said MOS power transistors N1 and N2 are high-drive switches and are driven by the high-side drivers HSD1 26 and HSD2 27, consequently the MOS power transistors N3 and N4 are low-side switches being driven by the low-side drivers LSD1 28 and LSD2 29. Said high-side drivers HSD1 26 and HSD2 27 are connected to the gates of said MOS power transistors N1 and N2 via the resistors 40. Said low-side drivers LSD1 28 and LSD2 29 are connected to the gates of said MOS power transistors N3 and N4 via the resistors 41.

Said motor H-bridge is connected to the battery supply $V_{bat}$ by an additional N-channel MOS transistor No to implement a reverse supply protection. Said reverse-supply protection module 23 prevents a short-circuit situation in connection with the diodes 45 shown in FIG. 4A and FIG. 4B. The external part of the circuitry 30, as indicated by a dotted line, comprises the N-channel MOS transistors N0, N1, N2, N3, and N4 plus the capacitors 24 and 25 of the charge pump and the reverse supply protection module 23 comprising a resistor 39 and said N-channel MOS transistor N0. Said transistor N0 is controlled by the reverse supply protection module 23 and is blocking any reverse supply current, These external components are connected to the ASIC 32 by I/O ports 31.

Figure 3A:
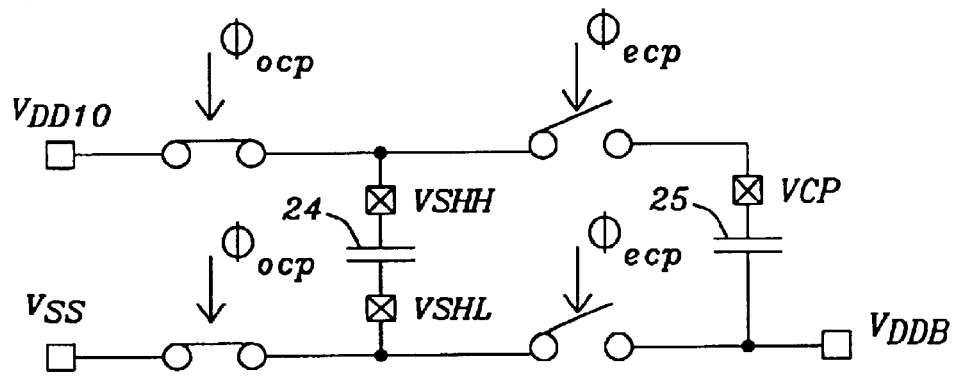
FIG. 3A+B show functional circuit diagrams of a charge pump.
Figure 3B:
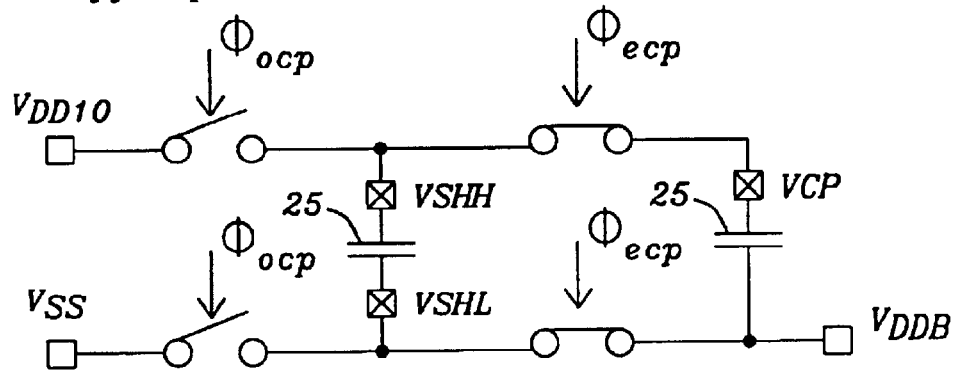

FIG. 3A and FIG. 3B show a functional circuit diagram of the charge pump 20 shown in FIG. 2A. Said charge pump 20 comprises a switching network controlled by a non-overlapping two-phase clocking scheme ($\Phi_{ecp}$, $\Phi_{ocp}$) and two external ceramic capacitors 24 and 25. Said two capacitors are also shown in FIG. 2A. The load capacity of this high-voltage generator depends on the resistive values of the switching network and the external capacitor values of capacitors 24 and 25 which can be flexibly adapted for target application requirements. Said clock-pulses $\Phi_{ecp}$ and $\Phi_{ocp}$ are generated by the control logic 33 shown in FIG. 2A.

FIG. 3A shows how in the "precharge (odd) phase" $\Phi_{ocp}$ the internally regulated voltage $V_{DD10}$, provided by the power management module 34 shown in FIG. 2A, which amounts to 10–11 Volts in a preferred embodiment, is charged into the external shuffle capacitor 24. During the "odd" phase the switch $\Phi_{ocp}$ is closed and switch $\Phi_{ecp}$ is open. FIG. 3B shows how with the following "shuffle (even) phase" $\Phi_{ecp}$ this charge is reloaded to the capacitor 25 that is connected to the battery potential $V_{DDB}$. Said clock pulses $\Phi_{ecp}$ and $\Phi_{ocp}$ are generated by control logic module 33 shown in FIG. 2A. During the "even" phase the switch $\Phi_{ecp}$ is closed and switch $\Phi_{ocp}$ is open. This produces an output voltage $V_{CP}$ being the sum of $V_{DDB}$ and $V_{DD10}$. Said output voltage $V_{CP}$ is required by the high-side drivers HSD1 26 and HSD2 27 to control the bases of the high-side N-channel MOS transistors N1 and N2 shown in FIG. 2A. In a preferred embodiment said battery potential $V_{DDB}$ can vary between 7.5 Volts and 18 Volts. This leads to an output voltage $V_{CP}$ varying between 14 Volts and 29 Volts.

Figure 4B:
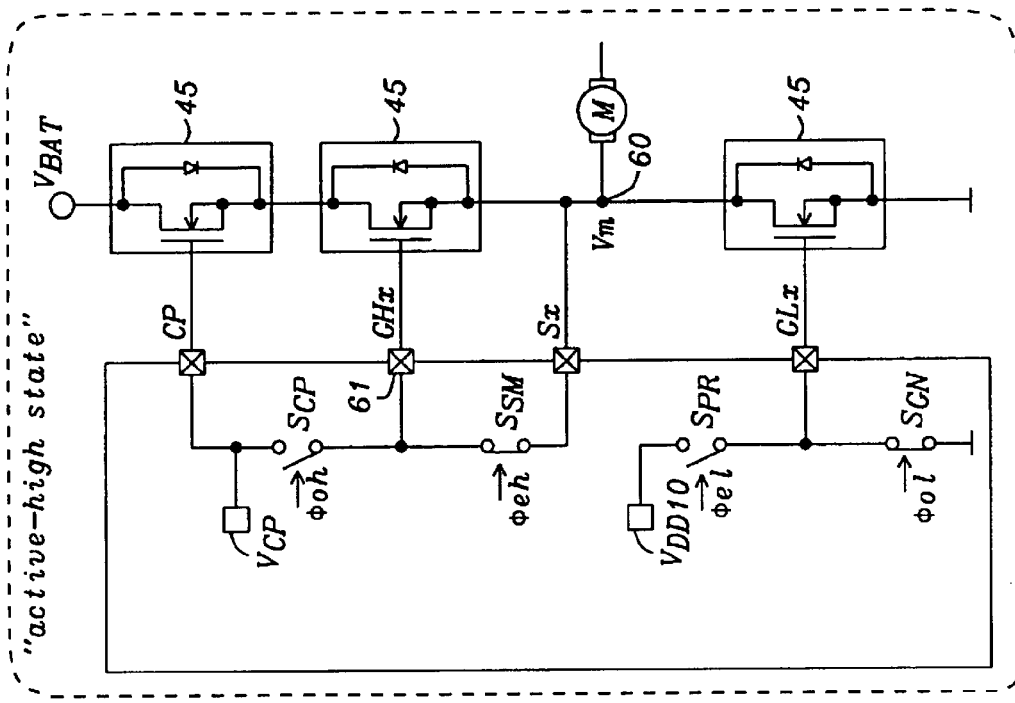
FIG. 4A+B show functional circuit diagrams for a motor half-bridge in active high and low state.
Figure 4A:
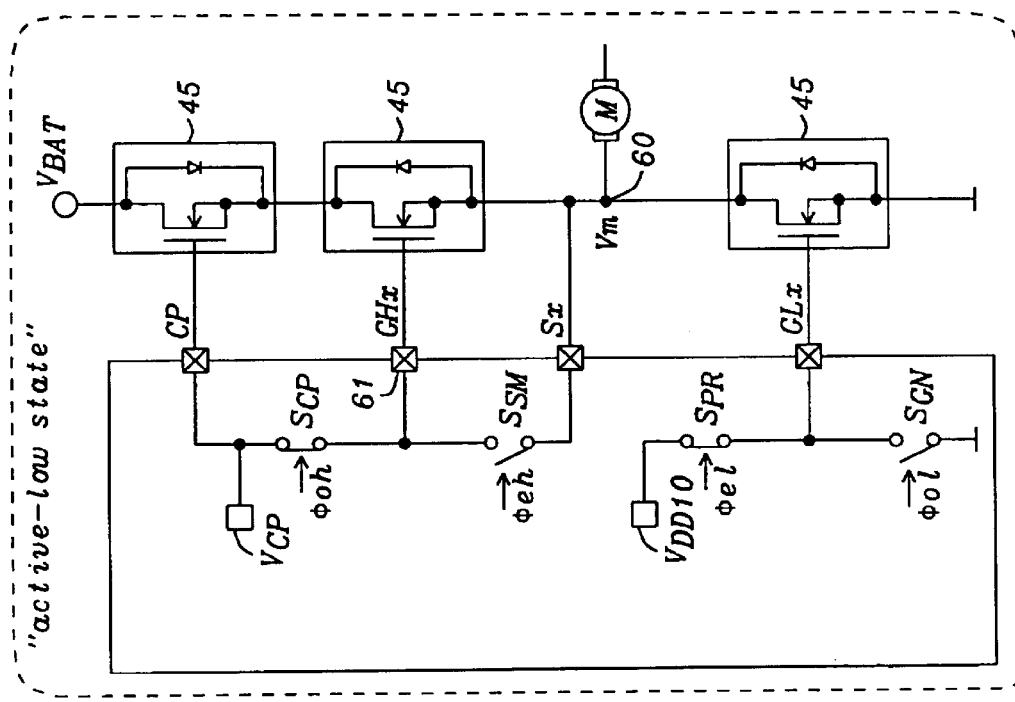

The gate drivers for the external N-channel MOS transistors work in a push-pull configuration. The functional circuit diagram based on a simplified switching network is shown in FIG. 4A+FIG. 4B. FIG. 4A shows a functional circuit diagram for a motor half-bridge in the "active-low" state and FIG. 4B shows said half-bridge in the "active-high" state. It is obvious that two half-bridges can be combined to a H-bridge. In the ASIC-implementation of a preferred embodiment these switches are replaced by high-voltage CMOS transistors (N- and P-channel types) and a sensitive gate voltage controlling circuitry. FIG. 4A+B show four external I/O pins CP, GHx, Sx, and GLx. Pin CP provides the output voltage of the charge pump, pin GHx represents the high-side driver gates GH1 and GH2 shown in FIG. 2A, pin Sx represents the mid-points S1 and S2 shown in FIG. 2A, and SLx represents the low-side driver gates GL1 and GL2 shown in FIG. 2A.

The diodes 45 of the external N-channel MOS transistors can connect the motor to battery level in certain states. This will be explained below.

A short-circuit detection is implemented with high-voltage input comparators. The threshold for short-circuit detection depends on the specific application as, e.g., a specific motor type. Said threshold is usually in the range of 2–4 Volts.

Controlled by the direction bit "DIR", shown in FIG. 2A, stored in a register of the control logic 22 shown in FIG. 2A, the opposite side of the H-bridge is constantly tied to the battery voltage level. The PWM signal is controlling the left side of the H-bridge if the direction bit "DIR" is "0" and is controlling the right side of the H-bridge if the "DIR" is "1".

In the "active-low state" a current is flowing from the battery, controlled by said direction bit, through one of the high-side N-channel transistors N1 or N2, through the motor and through the diagonally opposite low-side N-channel transistor N3 or N4 to ground. During said "active-low state" the motor is turning in a direction defined by the direction bit "DIR".

In the "active-high state", both high-side drivers HSD1 26 and HSD2 27 shown in FIG. 2A are active, defines the braking phase. In this braking phase the current is flowing through both high side both N-channel transistors N1 and N2 and through the motor.

The low-side driver supplies an output voltage of $V_{SS}$ (0V) if switch $S_{GN}$ is closed or supplies the voltage $V_{DD10}$ (e.g. 10V) if switch $S_{PR}$ is closed. The pull-down function of the high-side driver is realized by the switch $S_{SM}$ between the high-side gate GHx (to N1 or N2 shown in FIG. 2A) and the mid-point Sx (to S1 or S2, as shown in FIG. 2A) forming a virtual ground of the H-bridge circuit to achieve a zero voltage level at the transistor gate. The high-side driver supplies an output voltage of $V_{CP}$ ($V_{DDB}+V_{DD10}$) if switch $S_{CP}$ is closed, as shown in FIG. 3. The internal controlling sequence is shown in FIG. 5 and is based on a synchronized 4-phase clocking scheme to avoid cross-conduction and accurate timing.

Figure 5:
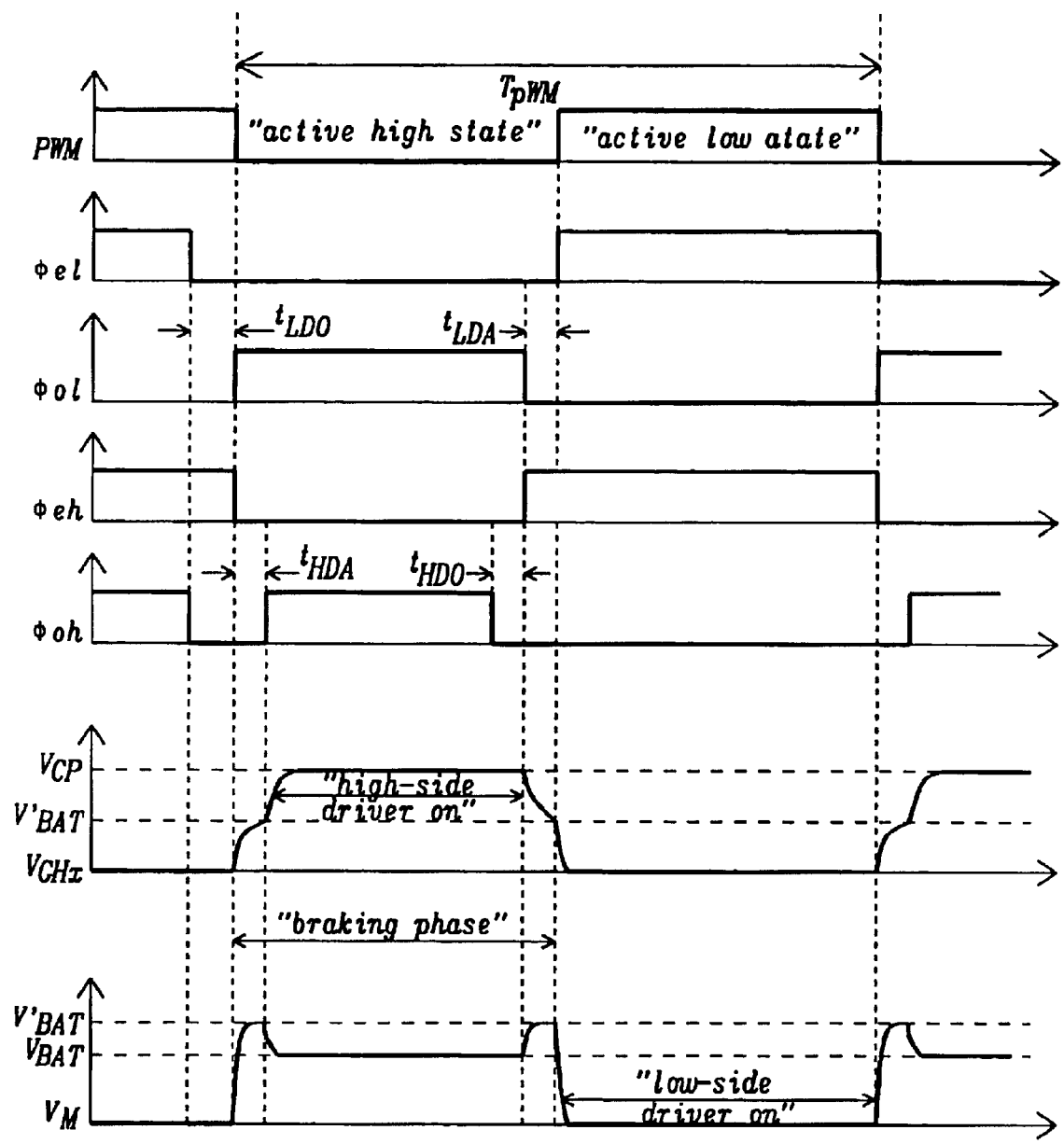
FIG. 5 shows half bridge switching sequences and output voltage.

FIG. 5 is showing the time charts of the PWM signal, the $\Phi_{el}$ signal activating the $S_{PR}$ switch, the $\Phi_{ol}$ signal activating the $S_{GN}$ switch, the $\Phi_{eh}$ signal activating the $S_{SM}$ switch, the $\Phi_{oh}$ signal activating the $S_{CP}$ switch, the voltage $V_{GHx}$ 61 at the base of a high-side driver, and the mid-point voltage $V_M$ 60 shown in FIG. 4A+4B. All said switches and voltages are shown in FIGS. 4A and 4B, all said signals are generated by the control logic unit 33 shown in FIG. 2A.

The duration of the "active-low state" is exactly the time defined by the PWM signal-width based on a frequency $t_{PWM}$ defined in a control register of the control logic 33 shown in FIG. 2A. In a preferred embodiment said frequency is in a range between 12–24 kHz. The duty cycle of said PWM signal is defining the speed of the DC-motor driven. Said "active-low state" is initiated by the positive edge of the signal $\Phi_{el}$ closing switch $S_{PR}$ shown in FIG. 4A+4B. To pass over to the braking phase the $\Phi_{el}$-clock has to set low and the positive $\Phi_{ol}$-clock edge, after a non-overlapping delay $t_{LDO}$, forces the motor braking phase. A free rotational state is achieved if $\Phi_{el}$ is low without the occurrence of a positive edge of $\Phi_{ol}$. This is usually an emerging brake situation during the delay-interval $t_{LDO}$ but can be used if a free rotational state is desired.

The diodes 45 of the external N-channel MOS transistors connect the motor to battery level in this high impedance state. Until the high-side N-channel MOS transistors are put through (positive edge of $\Phi_{oh}$-clock) the H-bridge mid-point $V_M$ appears a $V'_{BAT}$ (VDDB+0.8 Volt) as shown in FIG. 5. The programmable delay $t_{HDA}$ avoids the cross-conduction of the bridge transistor during the transient phase to a high-impedance state and the programmable delay $t_{HDO}$ avoids the cross-conduction of the bridge transistor during the transient phase to a low-impedance state. The braking phase is finished by setting the H-bridge again into the high-impedance state with the positive edge of $\Phi_{eh}$-clock after a delay of $t_{LDA}$ switching on the low-side transistor with $\Phi_{el}$-clock.

The preferred embodiment of the circuit invented has been built using CMOS technology for cost reasons. For those skilled in art it is obvious that said circuit could be built using bipolar or DMOS technology as well.

It is furthermore obvious that the load of said H-bridge is not limited to a DC-motor only. Any load within the maximum power limit could be used instead of a DC-motor with minimal customization effort.

While the invention has been particularly shown and described with reference to the preferred embodiments thereof, it will be understood by those skilled in the art that various changes in form and details may be made without departing from the spirit and scope of the invention.

What is claimed is:

1. A circuit to drive a high-voltage H-bridge using CMOS technology comprising:
    a control logic circuit having inputs and output, wherein a first input is a signal defining the direction of the current between the mid-points of the H-bridge and a second -input comprises control signals defining the behavior of said H-bridge and the output are control signals for high-side and low-side drivers of said H-bridge;
    a power management module having an input and outputs wherein the input is a battery voltage and a first output is a voltage to feed the low-side drivers and a second output feeds a
    charge pump to drive the high-side drivers of the H-bridge and to drive a module reverse supply protection, wherein said charge pump comprises a switching network controlled by a clocking scheme;
    said high-side drivers of the H-bridge each having inputs and an output, wherein a first input receives one of said output control signals from said control logic circuit and a second input is a voltage from said charge pump and the output is driving ione of the corresponding high-side transistors of said H-bridge via a resistor;
    a first voltage dividers, wherein a first resistor is coupled between the output of the first of said high-side drivers and a first midpoint of said H-bridge and a second resistor is coupled between said first midpoint and ground voltage, keeping the reference voltage of said first high-side drivers on the voltage levels of said first -midpoints of said H-bridge;
    a second voltage divider, wherein a first resistor is coupled between the output of the second of said high-side drivers and a second midpoint of said H-bridge and a second resistor is coupled between said second midpoint and ground voltage, keeping the reference voltage of said second high-side driver on the voltage level of said second midpoint of said H-bridge;
    said low-side drivers each having inputs and an output, wherein a first input receives one of said output control signals from said control logic circuit and a second input is the first output of said power management module and the output is driving one of the corresponding low-side transistors of said H-bridge;
    said two high-side transistors of said H-bridge being connected between the battery voltage and the mid-points of said H-bridge, the gates of each connected to the output of one of said corresponding high-side drivers;
    said two low-side transistors of said H-bridge being connected between the mid-points of said H-bridge and ground, the gate of each connected to the output of one of said corresponding low-side drivers; and a load between the midpoints of said H-bridge.

2. The circuit of claim 1 wherein said control logic circuit, said power management module, said charge pump said high-side drivers, said voltage dividers, and said low-side drivers are all implemented on one ASIC.

3. The circuit of claim 1 wherein said module for reverse supply protection and said high-side and low-side transistors are implemented outside of an ASIC.

4. The circuit of claim 1 wherein said clocking scheme is a two-phase clocking scheme.

5. The circuit of claim 1 wherein said charge pump comprises two external capacitors.

6. The circuit of claim 5 wherein said two external capacitors are ceramic capacitors.

7. The circuit of claim 1 wherein said module for reverse supply protection is driving a transistor to inhibit any reverse supply situation.

8. The circuit of claim 7 wherein said transistor is a N-channel MOS power transistor.

9. The circuit of claim 1 wherein said two high-side transistors are N-channel MOS power transistors.

10. The circuit of claim 1 wherein said two low-side transistors are N-channel MOS power transistors.

11. The circuit of claim 1 wherein the load of said H-bridge is controlled by signals using pulse width modulation (PWM).

12. The circuit of claim 1 wherein said load between the midpoints of said H-bridge is a DC-motor.

13. The circuit of claim 12 wherein the direction of the rotation of said DC-motor is controlled by a direction bit.

14. The circuit of claim 12 wherein the velocity of said DC motor is controlled by signals using pulse width modulation (PWM).

15. The circuit of claim 1 wherein said high-side drivers and said low-side drivers work in a push-pull configuration.

16. The circuit of claim 1 wherein each of said high-drivers comprises:
    a semiconductor switch;
    an analog controller having an input and an output, wherein the input are pulses defining the cycles of said semiconductor switch and the output are currents to control said switch; and
    a means to provide a bias voltage to said semiconductor switch.

17. The circuit of claim 16 wherein said semiconductor switch is a CMOS FET.

18. The circuit of claim 16 wherein said means to provide a bias voltage is a resistor.

* * * * *